(12) United States Patent
Lin

(10) Patent No.: US 9,299,640 B2
(45) Date of Patent: Mar. 29, 2016

(54) FRONT-TO-BACK BONDING WITH THROUGH-SUBSTRATE VIA (TSV)

(71) Applicant: Taiwan Semiconductor Manufacturing Co., Ltd, Hsin-Chu (TW)

(72) Inventor: Jing-Cheng Lin, HsinChu County (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 13/943,157

(22) Filed: Jul. 16, 2013

(65) Prior Publication Data

US 2015/0021784 A1    Jan. 22, 2015

(51) Int. Cl.
| | |
|---|---|
| *H01L 23/48* | (2006.01) |
| *H01L 21/768* | (2006.01) |
| *H01L 27/06* | (2006.01) |
| *H01L 23/00* | (2006.01) |
| *H01L 25/065* | (2006.01) |
| *H01L 25/00* | (2006.01) |

(52) U.S. Cl.
CPC ........ *H01L 23/481* (2013.01); *H01L 21/76898* (2013.01); *H01L 24/80* (2013.01); *H01L 24/92* (2013.01); *H01L 24/94* (2013.01); *H01L 25/0657* (2013.01); *H01L 25/50* (2013.01); *H01L 27/0688* (2013.01); *H01L 2224/0401* (2013.01); *H01L 2224/05025* (2013.01); *H01L 2224/05124* (2013.01); *H01L 2224/05147* (2013.01); *H01L 2224/05563* (2013.01); *H01L 2224/05564* (2013.01); *H01L 2224/05572* (2013.01); *H01L 2224/05573* (2013.01); *H01L 2224/05582* (2013.01); *H01L 2224/05647* (2013.01); *H01L 2224/05666* (2013.01); *H01L 2224/05681* (2013.01); *H01L 2224/08147* (2013.01); *H01L 2224/13* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2224/80013* (2013.01); *H01L 2224/80075* (2013.01); *H01L 2224/80091* (2013.01); *H01L 2224/80095* (2013.01); *H01L 2224/80896* (2013.01); *H01L 2224/9202* (2013.01); *H01L 2224/94* (2013.01); *H01L 2225/06524* (2013.01);

(Continued)

(58) Field of Classification Search
CPC .................. H01L 23/498; H01L 2224/80091; H01L 2924/1033
USPC .................................................. 257/744, 686
See application file for complete search history.

(56) References Cited

U.S. PATENT DOCUMENTS

| | | |
|---|---|---|
| 5,547,906 A | 8/1996 | Badehi |
| 5,952,725 A | 9/1999 | Ball |

(Continued)

*Primary Examiner* — Tran Tran
(74) *Attorney, Agent, or Firm* — Birch, Stewart, Kolasch & Birch, LLP

(57) ABSTRACT

Embodiments of mechanisms of forming a semiconductor device structure are provided. The semiconductor device structure includes a first semiconductor wafer and a second semiconductor wafer. The first semiconductor wafer includes a first transistor formed in a front-side of the first semiconductor wafer, and the second semiconductor wafer includes a second transistor formed in a front-side of the second semiconductor wafer. A backside of the second semiconductor wafer is bonded to the front-side of the first semiconductor wafer. The semiconductor device structure further includes an interconnect structure formed over the front-side of the second semiconductor wafer, and at least one first through substrate via (TSV) directly contacts a conductive feature of the first semiconductor wafer and the interconnect structure.

18 Claims, 9 Drawing Sheets

(52) U.S. Cl.
CPC ............... *H01L 2225/06541* (2013.01); *H01L 2225/06565* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01); *H01L 2924/10333* (2013.01); *H01L 2924/10335* (2013.01); *H01L 2924/10338* (2013.01); *H01L 2924/10342* (2013.01)

(56) References Cited

U.S. PATENT DOCUMENTS

| | | | |
|---|---|---|---|
| 6,448,661 B1 | 9/2002 | Kim et al. | |
| 7,354,798 B2 | 4/2008 | Pogge et al. | |
| 7,791,175 B2 | 9/2010 | Pyeon | |
| 7,825,024 B2 | 11/2010 | Lin et al. | |
| 7,898,095 B2 | 3/2011 | Patti et al. | |
| 7,943,428 B2 | 5/2011 | Gambino et al. | |
| 8,421,193 B2 | 4/2013 | Huang | |
| 8,563,403 B1 | 10/2013 | Farooq et al. | |
| 2007/0269978 A1 | 11/2007 | Shih et al. | |
| 2010/0178761 A1* | 7/2010 | Chen et al. | 438/613 |
| 2012/0193785 A1* | 8/2012 | Lin et al. | 257/737 |
| 2013/0020719 A1* | 1/2013 | Jung et al. | 257/774 |
| 2013/0169355 A1* | 7/2013 | Chen et al. | 327/564 |
| 2014/0151895 A1 | 6/2014 | West et al. | |

* cited by examiner

FRONT-TO-BACK BONDING WITH THROUGH-SUBSTRATE VIA (TSV)

CROSS REFERENCE TO RELATED APPLICATIONS

This application is related to the following co-pending an commonly assigned patent applications: U.S. application Ser. No. 13/943,224, filed on Jul. 16, 2013 and entitled "Hybrid bonding with through substrate via (TSV)", and U.S. application Ser. No. 13/943,245, filed on Jul. 16, 2013 and entitled "Mechanisms for forming three-dimensional integrated circuit (3DIC) stacking structure", and U.S. application Ser. No. 13/943,401, filed on Jul. 16, 2013 and entitled "Hybrid bonding with through substrate via (TSV)", and U.S. application Ser. No. 14/488,017, filed on Sep. 16, 2014 and entitled "Hybrid bonding with through substrate via (TSV).

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. Some 3DICs are prepared by placing dies over dies on a semiconductor wafer level. 3DICs provide improved integration density and other advantages, such as faster speeds and higher bandwidth, because of the decreased length of interconnects between the stacked dies, as examples. However, there are many challenges related to 3DICs.

BRIEF DESCRIPTION OF THE DRAWING

For a more complete understanding of the present disclosure, and the advantages thereof, reference is now made to the following descriptions taken in conjunction with the accompanying drawings, in which.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description may include embodiments in which the first and second features are formed in direct or indirectly contact.

Figure 1A:
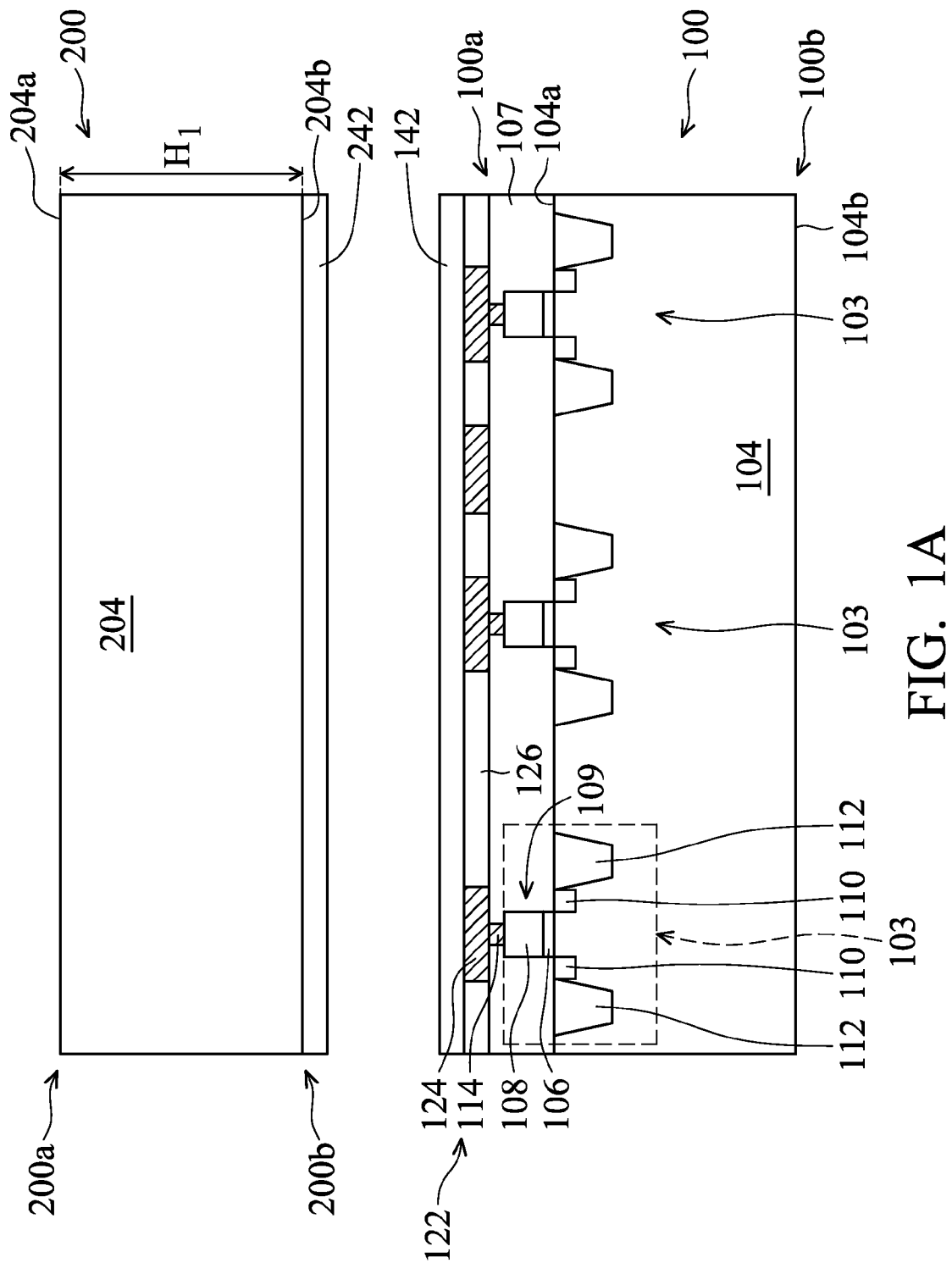
FIGS. 1A-1F show cross-sectional representations of various stages of forming a semiconductor device, in accordance with some embodiments of the disclosure.

Embodiments of the disclosure provide mechanisms of forming a semiconductor device. FIGS. 1A-1F show cross-sectional representations of various stages of forming a semiconductor device in accordance with some embodiments of the disclosure. Referring to FIG. 1A, a cross-sectional representation of a portion of a semiconductor wafer 100 and a portion of another semiconductor wafer 200 are shown in accordance with some embodiments.

Semiconductor wafer 100 includes a semiconductor substrate 104, which is made of silicon or other semiconductor materials and has a top surface 104a and a bottom surface 104b. Alternatively or additionally, semiconductor substrate 104 may include other elementary semiconductor materials such as germanium. In some embodiments, semiconductor substrate 104 is made of a compound semiconductor, such as silicon carbide, gallium arsenic, indium arsenide, or indium phosphide. In some embodiments, semiconductor substrate 104 is made of an alloy semiconductor such as silicon germanium, silicon germanium carbide, gallium arsenic phosphide, or gallium indium phosphide. In some embodiments, semiconductor substrate 104 includes an epitaxial layer. For example, semiconductor substrate 104 has an epitaxial layer overlying a bulk semiconductor.

Referring to FIG. 1A, device regions 103 are formed in a front-side 100a of semiconductor wafer 100 in a front-end-of-line (FEOL) process in some embodiments. Each device regions 103 includes a gate structure 109 embedded in a dielectric layer 107, source/drain regions 110, and isolation structures 112, such as shallow trench isolation (STI) structures. Gate structure 109 includes a gate dielectric layer 106, a gate electrode 108, and spacers (not shown). Device regions 103 shown in FIG. 1 are merely an example, and other devices may be formed in device regions 103.

Device regions 103 may form various N-type metal-oxide semiconductor (NMOS) and/or P-type metal-oxide semiconductor (PMOS) devices, such as transistors or memories, and the like, interconnected to perform one or more functions. Other devices, such as capacitors, resistors, diodes, photodiodes, fuses, and the like may also be formed in substrate 104. The functions of the devices may include memory, processing, sensors, amplifiers, power distribution, input/output circuitry, or the like. In some embodiments, device regions 103 include N-type metal-oxide semiconductor (NMOS) and/or P-type metal-oxide semiconductor (PMOS) transistors.

A metallization structure 122 is formed over substrate 104, e.g., over device regions 103. In some embodiments, metallization structure 122 includes interconnect structure, such as a contact plug 114 and conductive features 124. Conductive features 124 are embedded in an insulating material 126. Metallization structure 122 is formed in a back-end-of-line (BEOL) process in some embodiments. In some embodiments, contact plug 114 is made of conductive materials, such as copper, copper alloy, aluminum, alloys or combinations thereof. Conductive features 124 are also made of conductive materials. Alternatively, other applicable materials may be used. In some embodiments, contact plug 114 and conductive features 124 are made of conductive materials which are heat resistant, such as tungsten (W), Cu, Al, or AlCu. In some embodiments, insulating material 126 is made of silicon oxide. In some embodiments, insulating material 126 includes multiple dielectric layers of dielectric materials. One or more of the multiple dielectric layers are made of low dielectric constant (low-k) materials. In some embodiments, a top dielectric layer of the multiple dielectric layers is made of $SiO_2$. Metallization structure 122 shown is merely for illustrative purposes. Metallization structure 122 may include other configurations and may include one or more conductive lines and via layers.

A bonding layer 142, which is a dielectric layer, is formed over the front-side 100a of semiconductor wafer 100, e.g. on metallization structure 122. In some embodiments, bonding layer 142 is made of a silicon-containing dielectric, such as silicon oxide, silicon oxynitride or silane oxide.

In some embodiments, bonding layer 142 is formed by plasma enhanced chemical vapor deposition (PECVD). In some other embodiments, bonding layer 142 is formed by a spin-on method. In some embodiments, bonding layer 142 has a thickness in a range from about 5 nm to about 300 nm.

As shown in FIG. 1A, devices, such as transistor including gate structure 109, are formed in front-side 100a of semiconductor wafer 100, while no devices are formed in a backside 100b of semiconductor wafer 100.

Semiconductor wafer 200 includes a substrate 204, which is similar to substrate 104. Substrate 204 has a top surface 204a and a bottom surface 204b. A bonding layer 242, which is a dielectric layer, is formed over a backside 200b of semiconductor wafer 200, e.g. on bottom surface 204b of substrate 204. In some embodiments, bonding layer 242 is similar to bonding layer 142. No devices are pre-formed in semiconductor wafer 200.

As shown in FIG. 1A, substrate 204 has a height $H_1$ from top surface 204a to bottom surface 204b in a range from about 50 μm to about 775 μm.

Before semiconductor wafers 100 and 200 are bonded together, two bonding layers 142 and 242 are treated. Bonding layers 142 and 242 are treated by a dry treatment or a wet treatment. The dry treatment includes a plasma treatment. The plasma treatment is performed in an inert environment, such as an environment filled with inert gas including $N_2$, Ar, He or combinations thereof. Alternatively, other types of treatments may be used. In some embodiments, both of bonding layers 142 and 242 are made of silicon oxide, and a plasma process is performed to bonding layers 142 and 242 to form Si—OH bonds on the surface of bonding layers 142 and 242 prior to bonding.

Figure 1B:
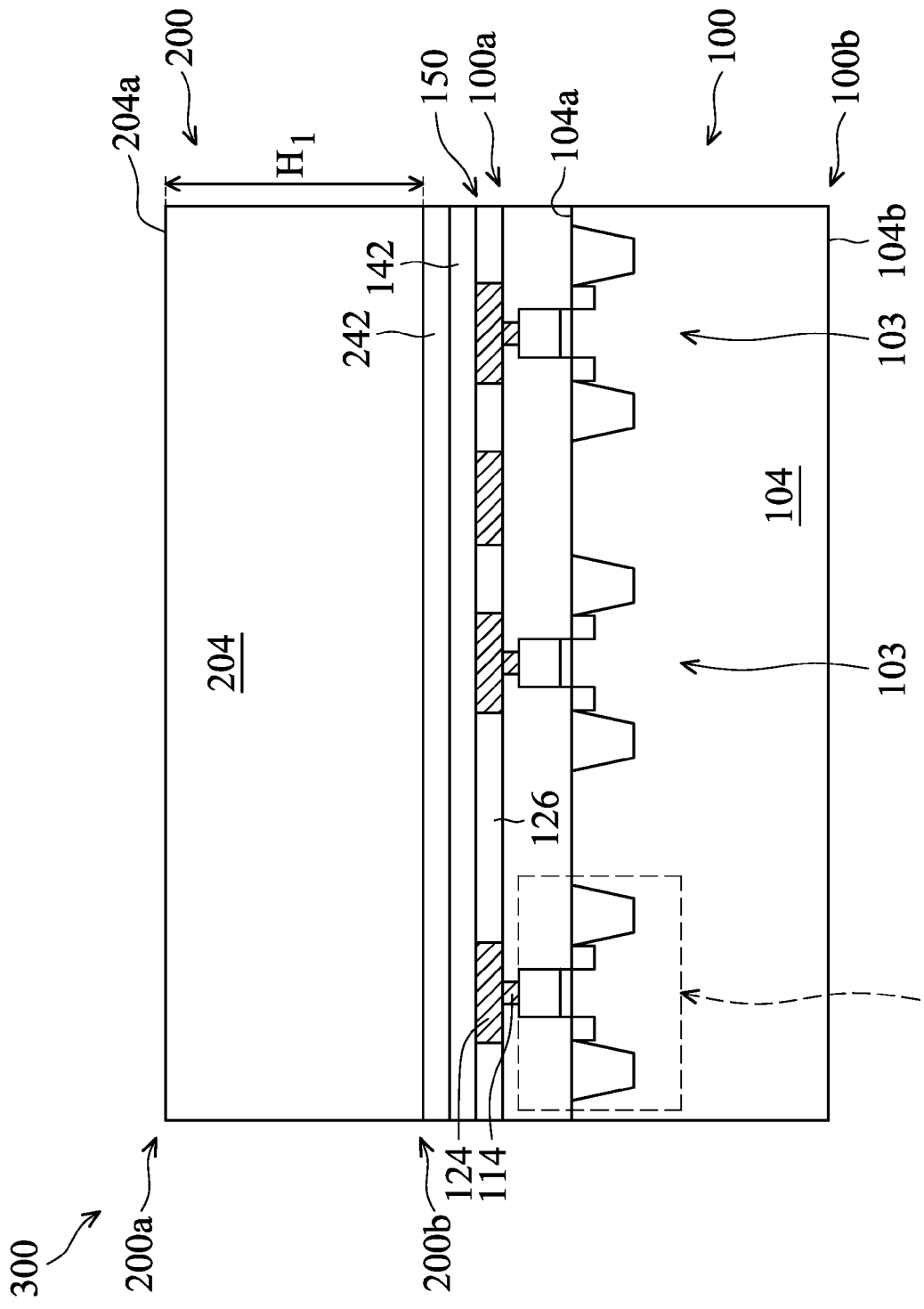

Referring to FIG. 1B, after the alignment is performed, semiconductor wafer 100 is boned to semiconductor wafer 200 to form a 3DIC stacking structure 300. As shown in FIG. 1B, when semiconductor wafer 200 is bonded to semiconductor wafer 100, bottom surface 204b of substrate 204 faces top surface 104a of substrate 104, and bonding layer 142 is bonded to bonding layer 242. Bonding of semiconductor wafers 100 and 200 is performed under pressure and heat. In some embodiments, the pressure for bonding is in a range from about 0.7 bar to about 10 bar. In some embodiments, the heat applied to semiconductor wafers 100 and 200 includes an anneal operation at a temperature in a range from about 20° C. to about 1000° C. The bonding process may be performed in an $N_2$ environment, an Ar environment, an He environment, an inert-mixing gas environment, or combinations thereof.

As shown in FIG. 1B, stacking structure 300 includes a bonding structure 150. Bonding structure 150 includes bonding layers 142 and 242 bonded together. Therefore, backside 200b of semiconductor wafer 200 is bonded to front-side 100a of semiconductor wafer 100. If some devices are formed in semiconductor wafer 200 before bonding, semiconductor wafers 100 and 200 have to be precisely aligned before bonding. In contrast, since no devices are pre-formed in semiconductor wafer 200, an aligning process is not required for bonding of semiconductor wafers 100 and 200.

Figure 1C:
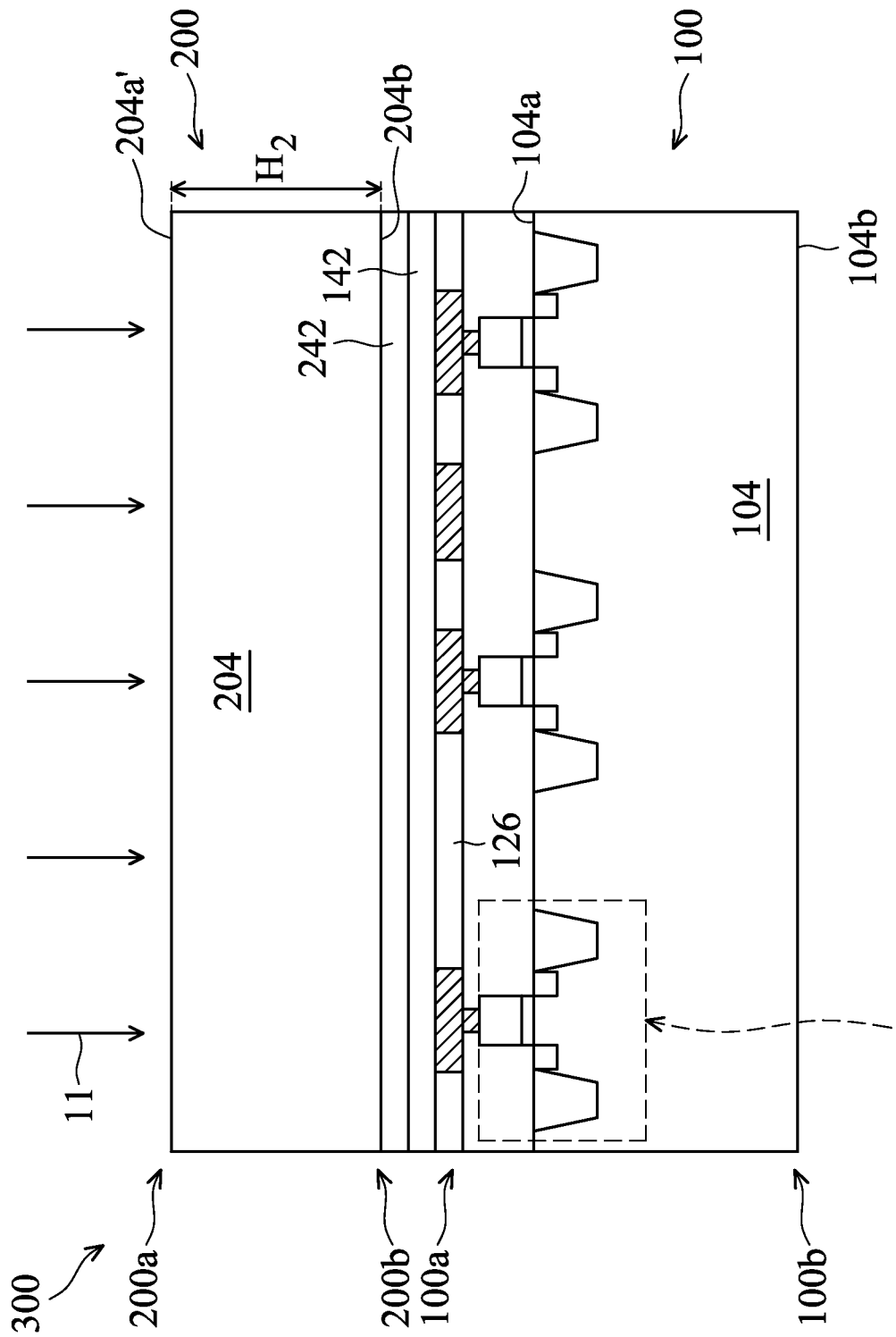

After bonding semiconductor wafers 100 and 200, a thinning process 11 is performed on top surface 204a of semiconductor wafer 200, referring to FIG. 1C. Thinning process 11 may include a grinding operation and a polishing operation (such as chemical mechanical polishing (CMP)). After thinning process 11, a wet etching operation is performed to remove the defects formed on top surface 204a of semiconductor wafer 200. After thinning process 11, substrate 204 has a height $H_2$ from top surface 204a' to bottom surface 204b of semiconductor substrate 204 in a range from about 0.2 μm to about 10 μm. Height $H_2$ is smaller than height $H_1$. In some embodiments, and a ratio of height $H_2$ to $H_1$ is in a range from about 0.0002 to about 0.99.

Figure 1D:
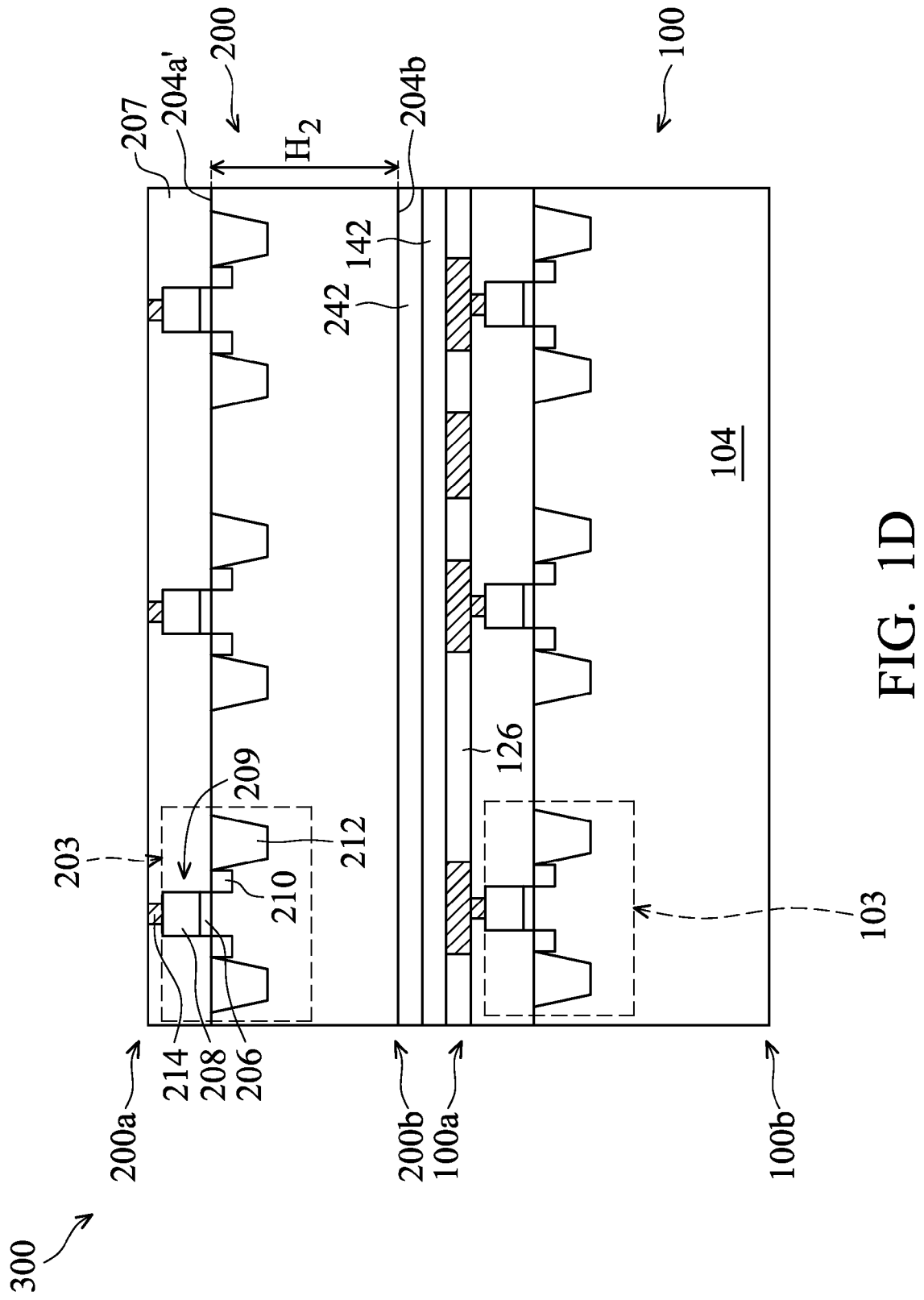

After thinning semiconductor wafer 200, device regions 203 are formed in front-side 200a of semiconductor wafer 200, referring to FIG. 1D. Device regions 203 are formed in a front-end-of-line (FEOL) process in some embodiments. Each device regions 203 includes a gate structure 209 embedded in a dielectric layer 207, source/drain regions 210, and isolation structures 212, such as shallow trench isolation (STI) structures. Gate structure 209 includes a gate dielectric layer 206, a gate electrode 208, and spacers (not shown). A contact plug 214 is formed over device regions 203, e.g. on gate structure 209. In some embodiments, formations of device regions 203 and contact plug 214 are performed under a relatively low temperature, such that metallization structure 122 will not be damaged during the processes. However, in some embodiments, metallization structure 122, including contact plug 114 and conductive features 124, are made of heat resistant conductive materials, and thus formations and materials of device regions 203 and contact plug 214 can be similar to those of device regions 103 and contact plug 114. In some embodiments, device regions 203 include NMOS and/or PMOS transistors.

As shown in FIG. 1D, devices, such as transistors including gate structure 209, are formed in front-side 200a of semiconductor wafer 200, while no devices are formed in backside 200b of semiconductor wafer 200. In addition, backside 200b of semiconductor wafer 200 is bonded to front side 100a of semiconductor wafer 100, and therefore the resulting stacking structure 300 is a front-to-back (face-to-back) stacking structure.

Figure 1E:
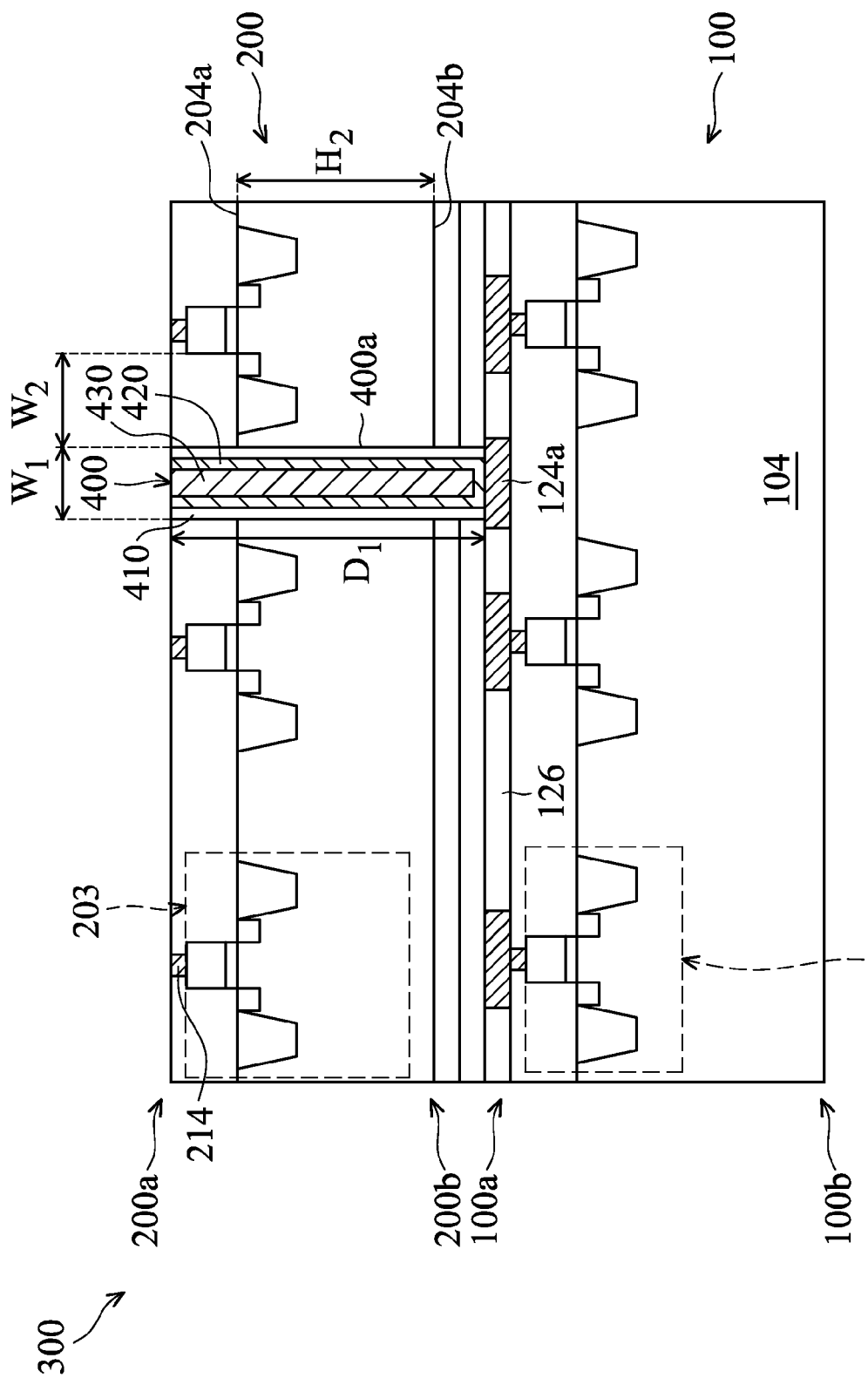

After device regions 203 are formed, through-substrate via (TSV) 400 is formed through second semiconductor wafer 200, referring to FIG. 1E. Through-substrate via (TSV) 400 is used to provide electrical connections and for heat dissipation for 3DIC stacking structure 300. Although FIG. 1E only shows one TSV, more than one TSV may be formed to pass through second semiconductor wafer 200.

TSV 400 includes a liner 410, a diffusion barrier layer 420, and a conductive material 430. TSV 400 is formed by the following operations. Firstly, a TSV opening is formed extending to conductive feature 124a of semiconductor wafer 100 by one or more etching processes. After the TSV opening is formed, liner 410 is formed on sidewalls of the TSV opening to act as an isolation layer, such that conductive materials of TSV 400 and semiconductor substrate 204 do not directly contact with each other. Afterwards, diffusion barrier layer 420 is conformally formed on liner 410 and on the bottom of the TSV opening. Diffusion barrier layer 420 is used to prevent conductive material 430, which will be formed later, from migrating to device regions 103 and 203. After diffusion barrier layer 420 is formed, conductive material 430 is used to fill into the TSV opening. Afterwards, excess liner 410, diffusion barrier layer 420, and conductive material 430, which are on the outside of the TSV opening, are removed by a planarization process, such as a chemical mechanical polishing (CMP) process, although any suitable removal process may be used.

Liner 410 is made of an insulating material, such as oxides or nitrides. Liner 410 may be formed by using a plasma enhanced chemical vapor deposition (PECVD) process or other applicable processes. Liner 410 may be a single layer or multi-layers. In some embodiments, liner 410 has a thickness in a range from about 100 Å to about 5000 Å.

In some embodiments, diffusion barrier layer 420 is made of Ta, TaN, Ti, TiN or CoW. In some embodiments, diffusion barrier layer 420 is formed by a physically vapor deposition (PVD) process. In some embodiments, diffusion barrier layer 420 is formed by plating. In some embodiments, conductive material 430 is made of copper, copper alloy, aluminum, aluminum alloys, or combinations thereof. Alternatively, other applicable materials may be used.

As shown in FIG. 1E, in some embodiments, TSV 400 has a width $W_1$ in a range from 0.025 μm to about 4 μm. In some embodiments, TSV 400 has a depth $D_1$ in a range from 0.2 μm to about 10 μm. In some embodiments, TSV 400 has an aspect ratio ($D_1/W_1$) in a range from 2 to about 15.

As shown in FIG. 1E, TSV 400 is used to connect conductive features 124a on semiconductor wafer 100 to second semiconductor wafer 200. If a TSV similar to TSV 400 is formed in semiconductor wafer 200 with a height $H_1$ as shown in FIG. 1B, the TSV will have a higher aspect ratio than TSV 400. With high aspect ratio, filling materials into the TSV opening becomes challenging. Voids may form in the TSV opening. In addition, due to insufficient sidewall coverage of liner 410 or diffusion barrier layer 420, some extrusion or diffusion problems related to conductive via material 430 may occur. In contrast, as shown in FIG. 1E, since the height of semiconductor wafer 200 is reduced from $H_1$ to $H_2$, TSV 400 has a relative smaller aspect ratio. Therefore, the void problems and the extrusion or diffusion problems resulting from a high aspect ratio of the TSV are resolved or greatly reduced. In addition, the overall package height of 3DIC stacking structure 300 is reduced to meet advanced packaging requirements. Therefore, 3DIC stacking structure 300 achieves small form factor.

In addition, devices in the vicinity of the TSV suffer from serious performance degradation due to the stress induced by the TSV. A keep-out zone (KOZ) is used to define a region where no devices could be placed within. In some embodiments, keep-out zone (KOZ) is defined by a distance $W_2$, which is measured from a sidewall 400a of TSV 400 to a nearest gate structure 209. Since semiconductor wafer 200 has a relatively small height $H_2$ due to thinning, the depth $D_1$ of TSV 400 is made smaller, resulting in a smaller width $W_1$. Therefore, overall stress induced by TSV 400 is reduced, and distance $W_2$ is also made smaller in FIG. 1E. In some embodiments, distance $W_2$ is in a range from about 0.01 μm to about 3 μm. When distance $W_2$ is smaller, a larger area of device regions 203 may be used. As a result, integrated intensity of devices in device regions 203 is further improved.

Figure 1F:
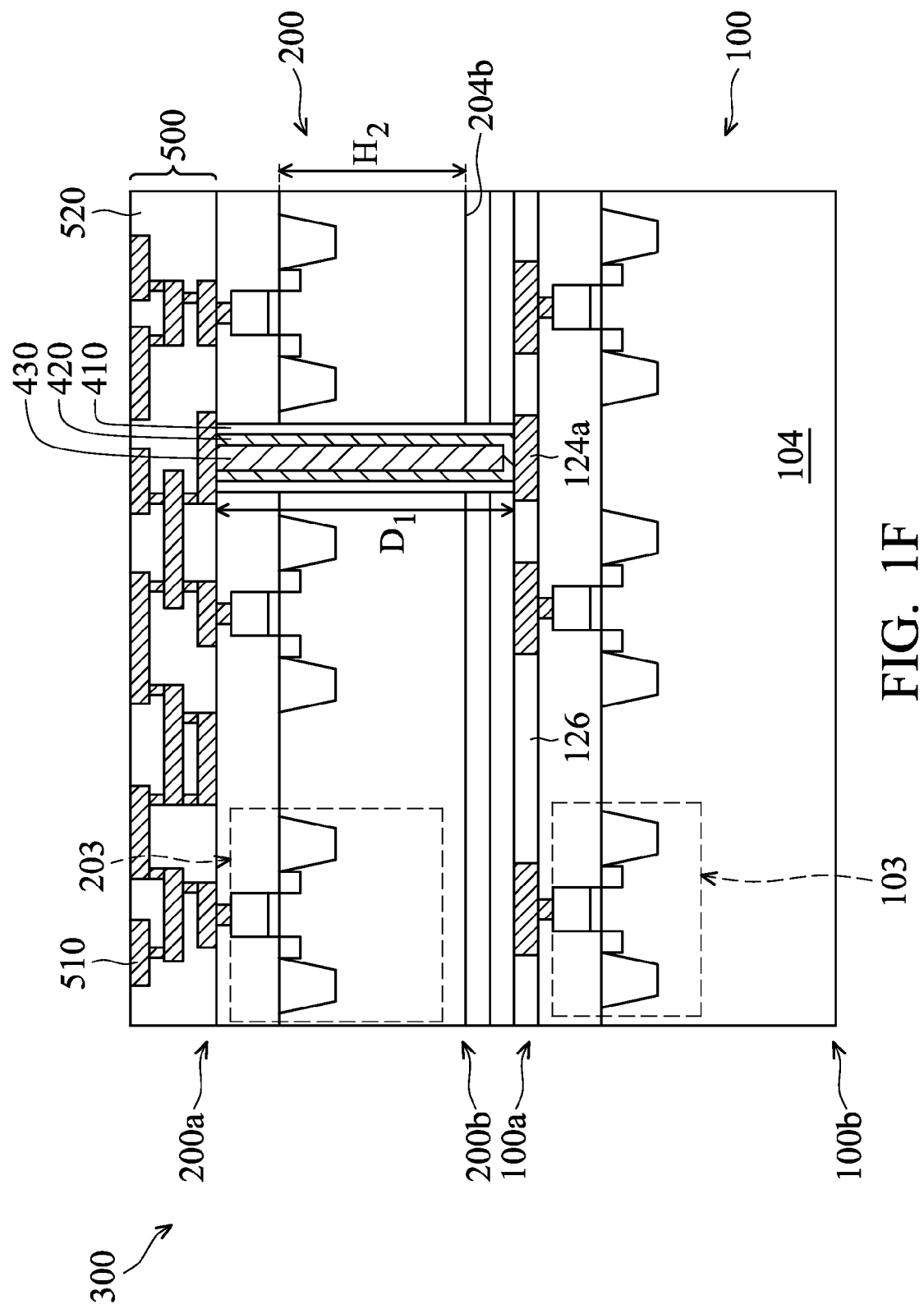

After TSV 400 is formed, an interconnect structure 500 is formed on front-side 200a of second semiconductor wafer 200, referring to FIG. 1F. Interconnect structure 500 is electrically connected to conductive features 124a of semiconductor wafer 100 via TSV 400. Interconnect structure 500 includes conductive features 510, such as conductive lines, vias, or conductive pads, formed in an insulating material 520. The metal routings of the conductive features shown in FIG. 1F, are merely examples. Alternatively, other designs of metal routings of conductive features may be used according to actual application.

As shown in FIG. 1F, in stacking structure 300, devices, such as transistors including gate structure 109, are formed in front-side 100a of semiconductor wafer 100 while no devices are formed in backside 100b of semiconductor wafer 100. Devices, such as transistors including gate structure 209, are formed in front-side 200a of semiconductor wafer 200 while no devices are formed in backside 200b of semiconductor wafer 200. Backside 200b of semiconductor wafer 200 is bonded to front-side 100a of semiconductor wafer 100, and therefore stacking structure 300 is a front-to-back structure. In addition, interconnect structure 500 is formed on front-side 200a of semiconductor wafer 200, and TSV 400 directly contacts interconnect structure 500 and conductive feature 124a of semiconductor wafer 100.

If devices are pre-formed on semiconductor wafer 200 before bonding to semiconductor wafer 100, semiconductor wafer 200 cannot be thinned since the devices are located on front-side 200a of semiconductor wafer 200. Therefore, it will be difficult to form a small TSV. In contrast, no devices are pre-formed on semiconductor wafer 200, and therefore semiconductor wafer 200 can be thinned from top surface 204a of substrate 204. After thinning process 11, the devices, such as transistors including gate structure 209, and TSV 400 could be subsequently formed in front-side 200a of semiconductor wafer 200. Therefore, a relatively small TSV 400 is formed in front-to-back 3DIC stacking structure 300.

In addition, other processes may also be performed to 3DIC stacking structure 300, and 3DIC stacking structure 300 may be diced to form individual chips afterwards.

Figure 2A:
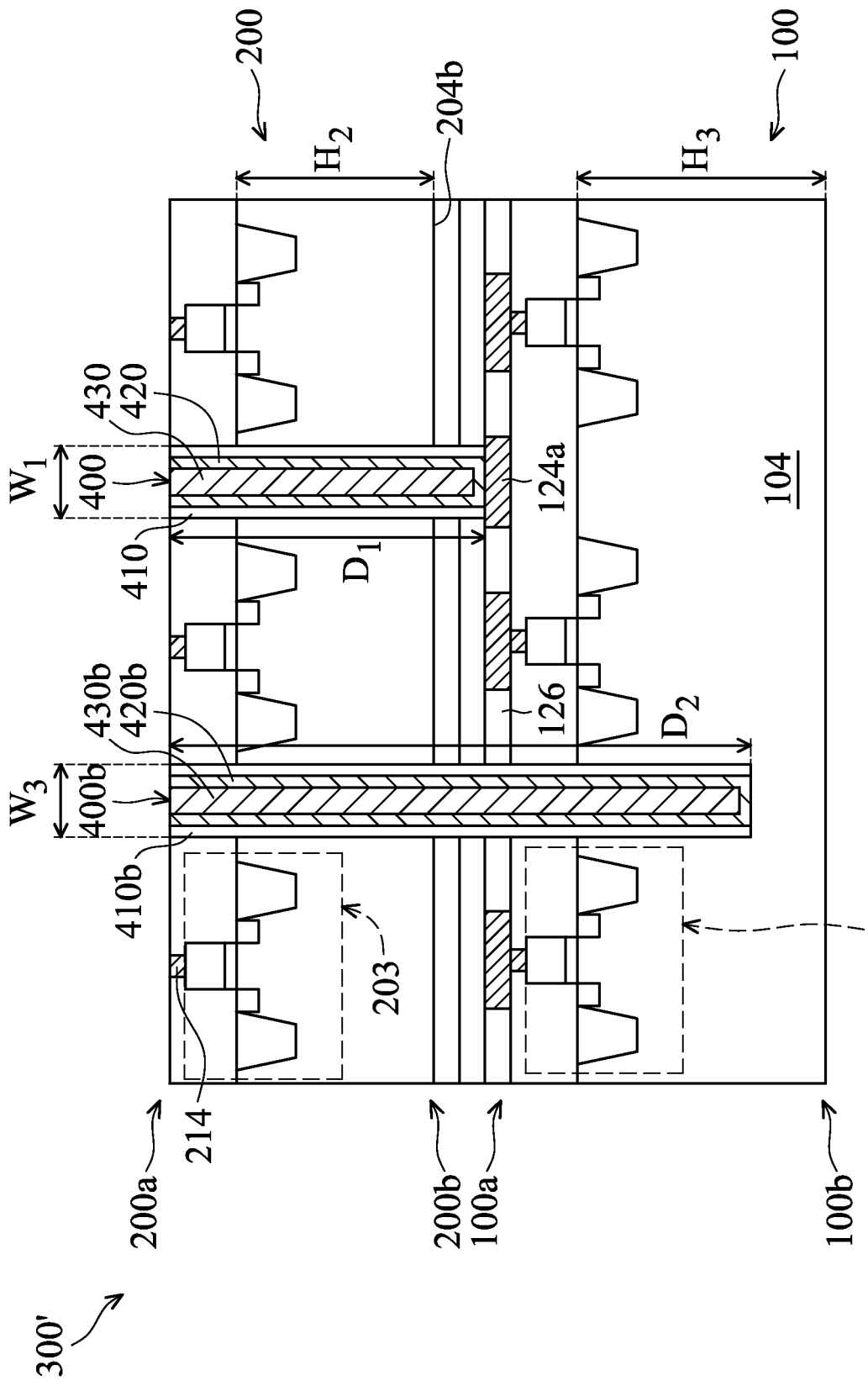
FIGS. 2A-2C show cross-sectional representations of various stages of forming a semiconductor device, in accordance with some embodiments of the disclosure.
Figure 2B:
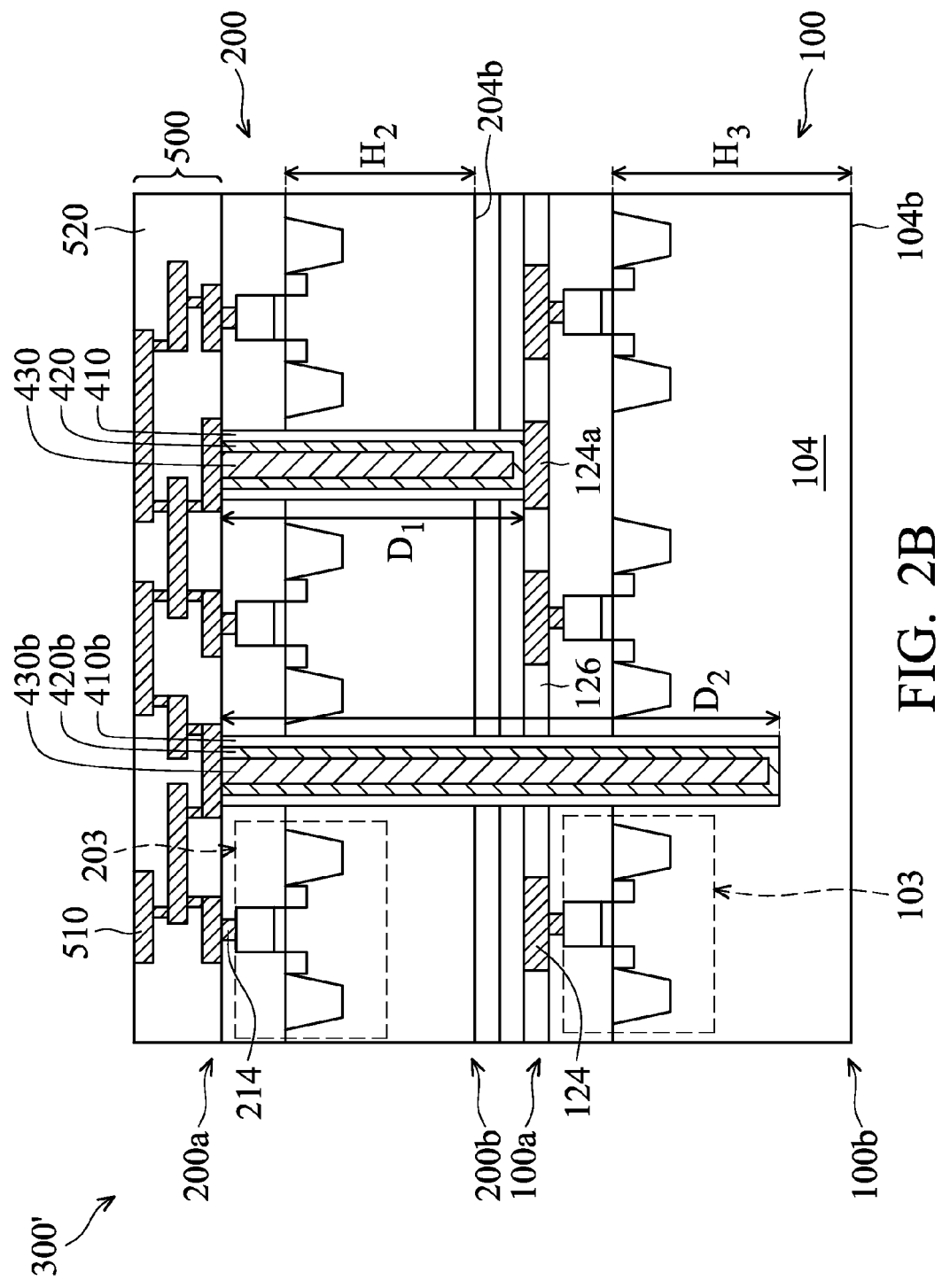
Figure 2C:
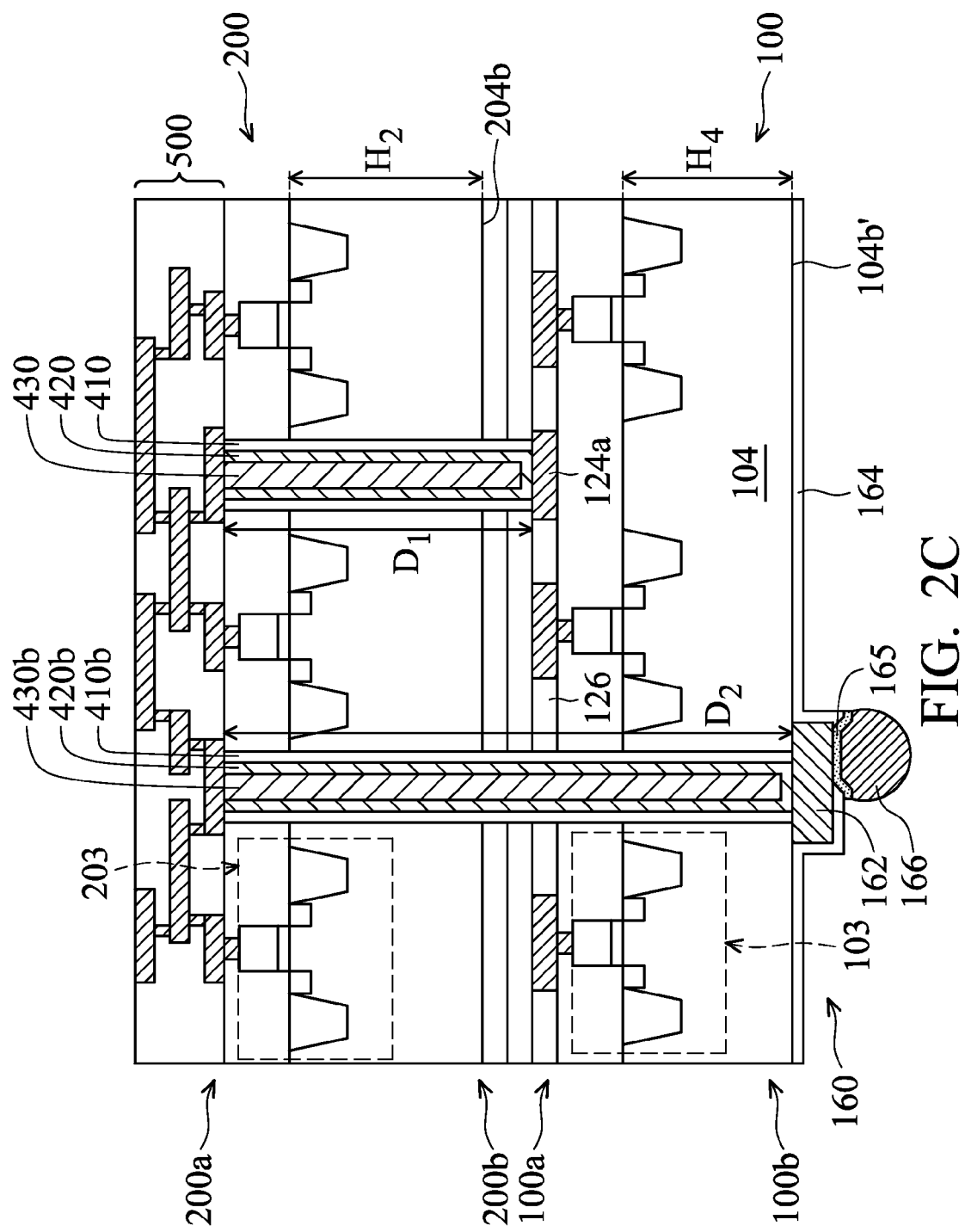

FIGS. 2A-2C show cross-sectional representations of various stages of forming a semiconductor device, in accordance with some embodiments of the disclosure. As shown in FIG. 2A, the 3D stacking structure 300' in FIG. 2A is almost the same with 3D stacking structure 300 except an additional TSV 400b is formed in semiconductor wafer 200. The formation of stacking structure 300' may involve additional patterning and etching processes. For example, a first TSV opening is formed through semiconductor wafer 200 to expose a portion of a conductive feature 124a of semiconductor wafer 100. After the first TSV opening is formed, a second TSV opening is formed through semiconductor wafer 200 to extend over device regions 103 of semiconductor wafer 100. Afterwards, liners 410b and 410, diffusion barrier layers 420b and 420, and conductive materials 430b and 430 are used to fill in the first and second TSV openings to form TSVs 400b and 400. As shown in FIG. 2A, TSV 400b includes liner 410b similar to liner 410, diffusion barrier layer 420b similar to diffusion layer 420, and conductive material 430b similar to conductive material 430, but TSV 400b further extends to a region in backside 100b of semiconductor wafer 100.

In some embodiments, TSV 400b has a width $W_3$ in a range from about 0.3 μm to about 10 μm. In some embodiments, TSV 400b has a depth $D_2$ in a range from about 15 μm to about 100 μm. In some embodiments, TSV 400b has an aspect ratio ($D_2/W_3$) in a range from about 5 to about 15. A ratio of depth $D_2$ to depth $D_1$ is in a range from about 2 to about 15.

Referring to FIG. 2B, interconnect structure 500 is formed on front-side 200a of semiconductor wafer 200. Interconnect structure 500 includes conductive features, such as conductive lines, vias, or conductive pads, formed in an insulating material. The metal routings of the conductive features shown in FIG. 2B, are merely an example. Alternatively, other designs of metal routings of conductive features may be used according to actual application. In some embodiments, substrate 104 has a height $H_3$ in a range from about 10 μm to about 100 μm.

After forming interconnect structure 500, semiconductor wafer 100 is thinned from bottom surface 104b of substrate 104 to expose a bottom of TSV 400b, referring to FIG. 2C. After the thinning process, redistribution (RDL) structure 160 is formed on backside 100b of semiconductor wafer 100 (e.g. thinned bottom surface 104b' of substrate 104). RDL structure 160 includes a metal pad 162 formed in a passivation layer 164. Metal pad 162 is electrically connected to exposed TSV 400b. In some embodiments, metal pad 162 is made of conductive materials with low resistivity, such as copper (Cu), aluminum (Al), Cu alloys, Al alloys, or other applicable materials. Although FIG. 2C only shows one RDL structure 160, more than one RDL structures may be formed.

An under bump metallization (UBM) layer 165 is formed on metal pad 162, and a conductive element 166 (such as solder ball) is formed over UBM layer 165. UBM layer 165 may contain an adhesion layer and/or a wetting layer. In some embodiments, UBM layer 165 is made of titanium (Ti), titanium nitride (TiN), tantalum nitride (TaN), tantalum (Ta), or the like. In some embodiments, UBM layer 165 further includes a copper seed layer. In some embodiments, conductive element 166 is made of conductive materials having low resistivity, such as solder or solder alloy. Exemplary elements included in the solder alloy may include Sn, Pb, Ag, Cu, Ni, Bi, or combinations thereof.

In some embodiments, interconnect structure 500 is electrically connected to another package (not shown) on the backside 100b of semiconductor wafer 100 via TSV 400b, RDL structure 160 and conductive element 166. In some embodiments, additional conductive structures, such as additional RDL structures, are formed over interconnect structure 500, such that semiconductor wafers 100 and 200 can be connected to other package substrates (not shown).

As shown in FIG. 2C, TSVs 400 and 400b individually provide different functions. TSV 400 directly contacts interconnect structure 500 and conductive feature 124a, and TSV 400b directly contacts interconnect structure 500 and RDL structure 160. Therefore, semiconductor wafer 200 is electrically connected to semiconductor wafer 100 via TSV 400, and semiconductor wafer 200 is electrically connected to another package structure (not shown) via interconnect structure 500 and TSV 400b. TSVs 400 and 400b provide a fast conductive path to connect semiconductor wafer 100, semiconductor wafer 200, and/or other package structures, without the formation of complicated metal routings.

Embodiments of mechanisms for forming a semiconductor device are provided. A backside of a second semiconductor is bonded to a front-side of a first semiconductor, which has devices, such as transistors, formed therein. After the second semiconductor wafer is bonded to the first semiconductor wafer, the front-side of the second semiconductor wafer without devices pre-formed therein is thinned. After the thinning process, devices, such as transistors, are formed in the front-side of the second semiconductor wafer to form a front-to-back (face-to-back) stacking structure. A relatively small TSV is formed in the front-to-back stacking structure. Alternatively, TSVs having different sizes are formed in the front-to-back stacking structure.

In some embodiments, a semiconductor device structure is provided. The semiconductor device structure includes a first semiconductor wafer and a second semiconductor wafer. The first semiconductor wafer includes a first transistor formed in a front-side of the first semiconductor wafer, and the second semiconductor wafer includes a second transistor formed in a front-side of the second semiconductor wafer. A backside of the second semiconductor wafer is bonded to the front-side of the first semiconductor wafer. The semiconductor device structure further includes an interconnect structure formed over the front-side of the second semiconductor wafer, and at least one first through substrate via (TSV) directly contacts a conductive feature of the first semiconductor wafer and the interconnect structure.

In some embodiments, a semiconductor device structure is provided. The semiconductor device structure includes a first semiconductor wafer and a second semiconductor wafer. The first semiconductor wafer includes a first transistor formed in a front-side of the first semiconductor wafer and a first bonding layer formed over the first transistor. The second semiconductor wafer includes a second transistor formed in a front-side of the second semiconductor wafer and a second bonding layer formed over a backside of the second semiconductor wafer. The second bonding layer is bonded to the first bonding layer. The semiconductor device structure further includes at least one first through substrate via (TSV) formed in the second semiconductor wafer and the first TSV has a first height. The semiconductor device structure further includes at least one second TSV formed in the first semiconductor wafer and the second semiconductor wafer, and the second TSV has a second height larger than the first height.

In some embodiments, a method for forming a semiconductor device structure is provided. The method includes providing a first semiconductor wafer and a second semiconductor wafer. A first transistor is formed in a front-side of the first semiconductor wafer, and no devices are formed in the second semiconductor wafer. The method further includes bonding the front-side of the first semiconductor wafer to a backside of the second semiconductor wafer and thinning a front-side of the second semiconductor wafer. After thinning the second semiconductor wafer, a second transistor is formed in the front-side of the second semiconductor wafer. At least one first through substrate via (TSV) is formed in the second semiconductor wafer, and the first TSV directly contacts a conductive feature of the first semiconductor wafer.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device structure, comprising:
   a first semiconductor wafer comprising a first transistor formed in a front-side of the first semiconductor wafer;
   a second semiconductor wafer comprising a second transistor formed in a front-side of the second semiconductor wafer, wherein a backside of the second semiconductor wafer is bonded to the front-side of the first semiconductor wafer by a bonding layer, and the bonding layer is formed between the first semiconductor wafer and the second semiconductor wafer;
   an interconnect structure formed over the front-side of the second semiconductor wafer, wherein the interconnect structure comprises a first conductive line and a second conductive line formed over the first conductive line;
   at least one first through substrate via (TSV) directly contacts a conductive feature of the first semiconductor wafer and the first conductive line of the interconnect structure, wherein the first conductive line has a first surface facing a top surface of the first TSV, and no via is formed on the first surface, and wherein the first TSV passes through the bonding layer, and the conductive feature is formed on the first transistor; and
   a first redistribution (RDL) structure formed on a backside of the first semiconductor wafer; and
   at least one second TSV directly contacts the interconnect structure and the first RDL structure.

2. The semiconductor device structure as claimed in claim 1, further comprising:
   a package substrate formed over the first RDL structure, wherein the second semiconductor wafer is electrically connected to the package substrate via the second TSV.

3. The semiconductor device structure as claimed in claim 2, wherein the first TSV has a first depth, and the second TSV has a second depth larger than the first depth.

4. The semiconductor device structure as claimed in claim 3, wherein a ratio of the second depth to the first depth is in a range from about 2 to about 15.

5. The semiconductor device structure as claimed in claim 1, wherein the first semiconductor wafer further comprises a first bonding layer on the front-side of the first semiconductor wafer, and the second semiconductor wafer further comprises a second bonding layer on the backside of the second semiconductor wafer, and the first bonding layer is bonded to the second bonding layer.

6. The semiconductor device structure as claimed in claim 5, wherein the first bonding layer and the second bonding layer are respectively made of silicon oxide, silicon oxynitride or silane oxide.

7. The semiconductor device structure as claimed in claim 1, wherein the first TSV has an aspect ratio in a range from about 2 to about 15.

8. The semiconductor device structure as claimed in claim 1, wherein the first TSV further comprises:
   a liner formed on sidewalls of a first TSV opening;
   a diffusion barrier layer conformally formed on the liner and bottom of the first TSV opening; and
   a conductive material formed on the diffusion barrier layer.

9. The semiconductor device structure as claimed in claim 1, wherein a keep-out zone (KOZ) defined by a distance measured from the sidewall of the first TSV to a device in the second semiconductor wafer is in a range from about 0.01 µm to about 3 µm.

10. A semiconductor device structure, comprising:
    a first semiconductor wafer comprising a first transistor formed in a front-side of the first semiconductor wafer and a first bonding layer formed over the first transistor;
    a second semiconductor wafer comprising a second transistor formed in a front-side of the second semiconductor wafer and a second bonding layer formed over a backside of the second semiconductor wafer, wherein the second bonding layer is bonded to the first bonding layer;
    at least one first through substrate via (TSV) formed in the second semiconductor wafer, wherein the first TSV has a first height, and the first TSV passes through the first bonding layer and the second bonding layer; and
    at least one second TSV formed in the first semiconductor wafer and the second semiconductor wafer, wherein the second TSV has a second height larger than the first height.

11. The semiconductor device structure as claimed in claim 10, wherein the first height is in a range from about 0.2 µm to about 10 µm, and the second height is in a range from about 15 µm to about 100 µm.

12. The semiconductor device structure as claimed in claim 10, wherein the first TSV has an aspect ratio in a range from about 2 to about 15, and the second TSV has an aspect ratio in a range from about 5 to about 15.

13. The semiconductor device structure as claimed in claim 10, further comprising:
    an interconnect structure formed over the front-side of the second semiconductor wafer.

14. The semiconductor device structure as claimed in claim 13, wherein the first TSV directly contacts the interconnect structure and a conductive feature of the first semiconductor wafer, and the conductive feature is formed on the first transistor.

15. The semiconductor device structure as claimed in claim 13, wherein the second TSV directly contacts the interconnect structure and a redistribution (RDL) structure formed over a backside of the first semiconductor wafer.

16. The semiconductor device structure as claimed in claim 15, further comprising:
    a package substrate formed over the RDL structure, wherein the second semiconductor wafer is electrically connected to the package substrate via the second TSV.

17. The semiconductor device structure as claimed in claim 10, wherein the first semiconductor wafer further comprises a first bonding layer on the front-side of the first semiconductor wafer, and the second semiconductor wafer further comprises a second bonding layer on the backside of the second semiconductor wafer, and the first bonding layer is bonded to the second bonding layer.

18. The semiconductor device structure as claimed in claim 10, wherein a keep-out zone (KOZ) defined by a distance measured from the sidewall of the first TSV to a device in the second semiconductor wafer is in a range from about 0.01 µm to about 3 µm.

* * * * *